(12) United States Patent
Fontecha et al.

(10) Patent No.: US 6,448,507 B1
(45) Date of Patent: Sep. 10, 2002

(54) SOLDER MASK FOR CONTROLLING RESIN BLEED

(75) Inventors: Edwin Fontecha, San Jose; Viswanath Valluri, Sunnyvale; Donald Bottarini, Los Gatos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/799,580

(22) Filed: Mar. 7, 2001

Related U.S. Application Data

(60) Provisional application No. 60/214,782, filed on Jun. 28, 2000.

(51) Int. Cl.$^7$ .................................................. H05K 1/16
(52) U.S. Cl. ........................ 174/260; 174/261; 361/776; 361/779
(58) Field of Search ................................ 174/260, 261, 174/255; 361/767, 776, 779, 783

(56) References Cited

U.S. PATENT DOCUMENTS

| 5,488,542 | A | * | 1/1996 | Ito ............................... 361/793 |
| 5,756,380 | A | * | 5/1998 | Berg et al. .................. 438/126 |
| 5,808,873 | A | * | 9/1998 | Celaya et al. ............... 361/760 |
| 5,893,508 | A | * | 4/1999 | Oh .............................. 228/4.5 |
| 5,953,213 | A | * | 9/1999 | Napierala .................... 361/760 |
| 6,046,500 | A | * | 4/2000 | Fey et al. .................... 257/729 |

\* cited by examiner

*Primary Examiner*—Albert W. Paladini

(57) ABSTRACT

Damage to and short circuiting of bond fingers on a substrate due to die-attach resin bleed is prevented, thereby increasing yield and improving reliability. Embodiments include forming a trough in a solder mask on a substrate between the bond fingers and semiconductor chip to prevent the die-attach resin from reaching the bond fingers.

11 Claims, 2 Drawing Sheets

SOLDER MASK FOR CONTROLLING RESIN BLEED

RELATED APPLICATIONS

This application claims priority from Provisional Application No. 60/214,782 filed on Jun. 28, 2000 entitled "SOLDER MASK FOR CONTROLLING RESIN BLEED", the entire disclosure of which is hereby incorporated by reference herein.

TECHNICAL FIELD

The present invention relates generally to semiconductor packaging technology. The present invention has particular applicability to semiconductor packaging comprising a semiconductor chip attached to a substrate with an adhesive resin and electrically connected to bond fingers on the substrate.

BACKGROUND ART

Various types of semiconductor packages, such as a ball grid array (BGA) package, comprise a circuitized organic substrate having a solder mask thereon with exposed bond fingers. A semiconductor chip is attached to the substrate, typically via the solder mask, by an adhesive resin. Conventional solder masks comprise epoxy-based resins, acrylate-based resins and combinations of epoxy-based and acrylate-based resins. Typical adhesives for attaching the semiconductor chip to the substrate include epoxy-based adhesives, acrylate-based adhesives, silicones and polyimides. Although such adhesives are fairly viscous, they exhibit a tendency to bleed or spread over the surface of the underlying solder mask which exhibits a low surface tension and is designed to prevent bridging of solder material and shorting. The spreading or bleeding adhesive resin typically comes into contact with and covers a portion of the bond fingers exposed on the surface of the underlying substrate, thereby not only interfering with attachment of the bond wires to the bond fingers not causing short circuiting, since such die-attach adhesive resin is typically conductive and causes an undesirable reaction with the bond fingers.

A prior approach to this problem is disclosed by Fey et al. in U.S. Pat. No. 6,046,500 and comprises treating a surface of the substrate with a fluorine-containing plasma to reduce the spread of the adhesive resin onto preselected sites of the substrate surface.

There exists a continuing need for a simplified approach to the adhesive resin bleed problem that causes damage to and/or short circuiting of bond fingers on a circuitized substrate.

SUMMARY OF THE INVENTION

An advantage of the present invention is a circuit assembly comprising a solder mask structured to prevent a bleeding adhesive resin from coming into contact with bond fingers on the upper surface of a circuitized substrate.

Additional advantages and features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention the foregoing and other advantages are achieved in part by a circuit assembly comprising: a substrate having an upper surface; a plurality of bond fingers on the upper surface of the substrate; a solder mask on the upper surface of the substrate leaving the plurality of bond fingers exposed; a semiconductor chip attached to the upper surface of the substrate with an adhesive resin therebetween; and an opening in the solder mask extending between the semiconductor chip and the plurality of bond fingers, wherein the opening prevents the adhesive resin from coming into contact with any of the plurality of bond fingers.

Embodiments of the present invention comprise a solder mask having an opening in the form of a trough extending between at least one row of bond fingers and at least one side of the semiconductor chip and substantially parallel to the side of the semiconductor chip. Embodiments of the present invention further include a plurality of bond wires, each bond wire electrically connected between a bond pad on an upper surface of the semiconductor chip and a bond finger. Fabricated packages in accordance with embodiments of the present invention include a semiconductor chip attached to a solder mask on an upper surface of a circuitized organic substrate, with adhesive resin extending from under the semiconductor chip beyond the sides of the semiconductor chip and partially filling the trough such that the adhesive resin does not come into contact with any of the bond fingers.

Additional advantages of the present invention will become readily apparent to those skilled in the art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

DESCRIPTION OF THE PRESENT INVENTION

Figure 1:
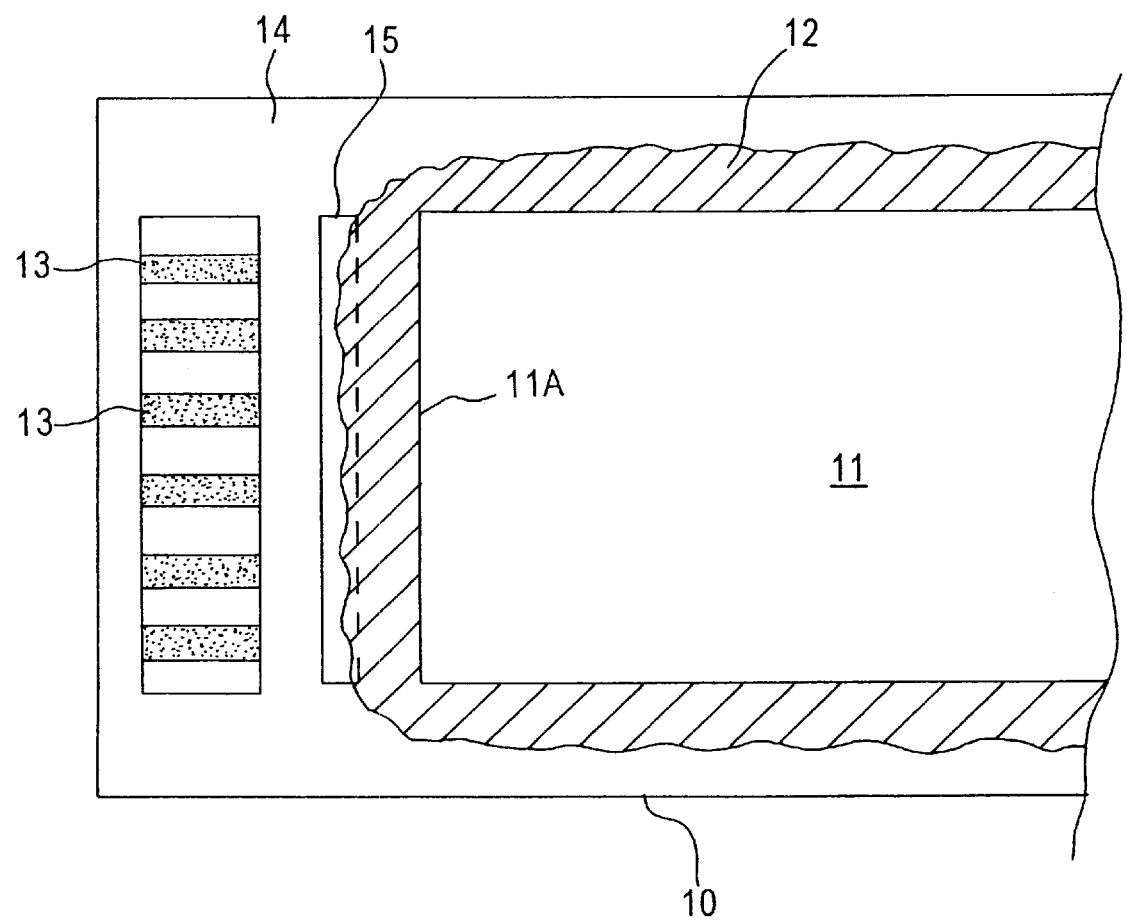
FIG. 1 schematically illustrates, in plan view, a portion of a semiconductor package in accordance with an embodiment of the present invention.

The present invention addresses and solves the problem of damage to and shorting of bond fingers on an upper surface of a circuitized organic substrate due to contact with a bleeding adhesive resin during attachment of a semiconductor tip to the substrate. Conventional technology comprises forming a solder mask having low surface friction on an upper surface of a circuitized organic substrate leaving bond fingers exposed, and attaching a semiconductor chip to the solder mask using a conductive adhesive resin. However, such resins have a tendency to bleed over the surface of the underlying low friction solder mask and come into contact with bond fingers causing damage to and/or short circuiting thereof. The present invention addresses and solves this problem by structuring the solder mask to prevent bleeding adhesive resin from coming into contact with the bond fingers.

In accordance with embodiments of the present invention, an opening, such as a trough, is formed in the solder mask extending between the semiconductor chip and bond fingers.

In this way, resin bleeding during attachment of the semiconductor chip to the substrate falls into the trough, thereby avoiding contact of the bond fingers with the bleeding adhesive resin.

Embodiments of the present invention include a semiconductor package comprising a circuitized organic substrate having a plurality of bond fingers substantially aligned in a row or an arc and extending substantially parallel to at least one side surface or around the chip, e.g., substantially parallel to opposing side surfaces, of a semiconductor chip attached to the substrate by an adhesive resin, with the adhesive resin bleeding from under the semiconductor chip beyond the side surfaces of the semiconductor chip along and on the solder mask formed between the substrate and the semiconductor chip. The solder mask is provided with a trough extending between each row of bond fingers and a side surface of the chip such that a straight line can not be drawn between the row of bond fingers and the side surface of the semiconductor chip without intersecting the trough.

Given the disclosed objectives, the optimum dimensions of the trough can be determined in a particular situation. For example, the trough can have a width of about 0.05 mm to about 0.20 mm, e.g., about 0.1 mm to about 0.15 mm, and a depth of about 0.03 mm to about 0.05 mm, e.g., about 0.03 mm to about 0.035 mm.

The solder mask employed in the present invention comprise a material conventional employed for solder masks, such as an epoxy-based resin, an acrylate-based resin, or a combination of an epoxy-based and acrylate-based resins. The adhesive resin employed in the present invention can be any adhesive resin conventionally employed to die-attach a semiconductor chip to a substrate, such as epoxy-based resins, acrylate-based resins, silicones and polyimides. Substrates suitable for use in embodiments of the present invention can comprise a conventional circuitized organic substrate, such as a substrate conventionally employed in a typically BGA package having solder balls attached to a bottom surface thereof.

Figure 2:
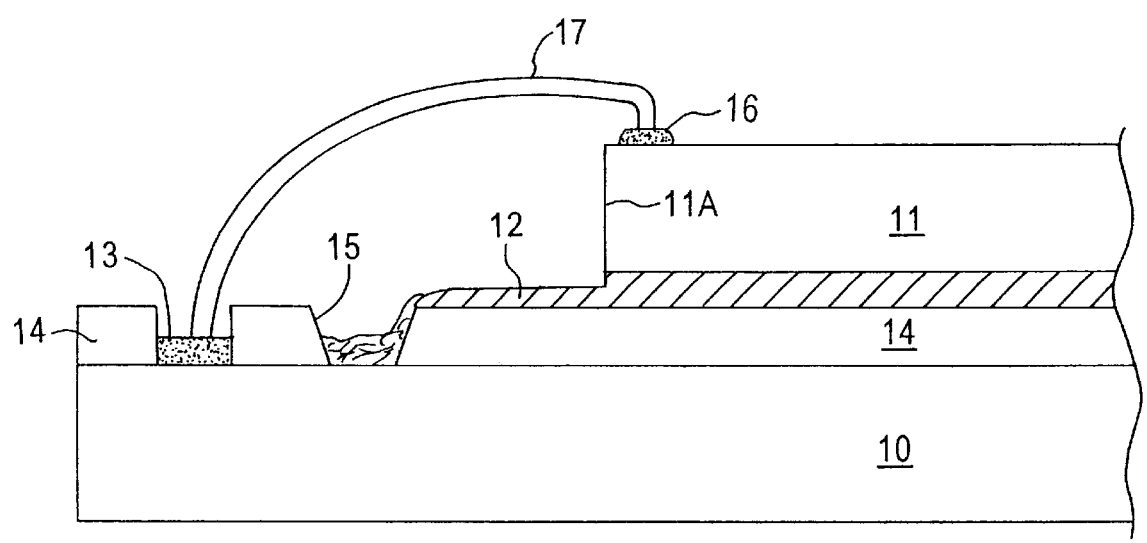
FIG. 2 schematically illustrates, in cross-sectional view, a portion of a semiconductor package in accordance with an embodiment of the present invention.

An embodiment of the present invention is schematically illustrated in FIGS. 1 and 2, wherein like elements are denoted by like reference numerals. Adverting to FIGS. 1 and 2, a solder mask 14 is formed on an upper surface of a circuitized organic substrate 10 leaving a plurality of bond fingers 13 exposed. Bond fingers 13 extend in a row substantially parallel to a side surface of semiconductor chip 11 attached to the substrate via solder mask 14 and conductive adhesive resin 12. Solder mask 14 is provided with a trough 15 between the row of bond fingers 13 and side surface 1l A of semiconductor chip 11. Bond fingers 13 are electrically connected to a plurality of bond pads 16 on an upper surface of semiconductor chip 11 by means of bond wires 17. The strategic formation of trough 15 in solder mask 14 prevents bleeding adhesive resin 12 from reaching bond fingers 13. Typically, the bleeding resin 12 would extend into trough 15.

The present invention comprises a strategically formed solder mask to prevent bleeding die-attach resin from coming into contact with bond fingers on an upper surface of a circuitized substrate, thereby preventing damage to and/or shorting of bond fingers in a cost effective efficient manner. The present invention is applicable to any of various types of integrated circuit packages, particularly BGA packages.

Only the preferred embodiments of the present invention and an example of its versatility are shown: and described in the present disclosure. It is to be understood that the present invention is capable of use in various other combination and environments, and is capable of changes or modifications within the scope of the inventive concept as expressed herein.

What is claimed is:

1. A circuit assembly comprising:

a substrate having an upper surface;

a plurality of bond fingers on the upper surface of the substrate;

a solder mask on the upper surface of the substrate leaving the plurality of bond fingers exposed;

a semiconductor chip attached to the upper surface of the substrate with an adhesive resin therebetween; and an opening in the solder mask extending between the semiconductor chip and the plurality of bond fingers, wherein the opening prevents the adhesive resin from coming into contact with any of the plurality of bond fingers, and wherein the semiconductor chip is attached to the solder mask with the adhesive.

2. The circuit assembly to claim 1, wherein the opening is in the form of a trough.

3. The circuit assembly according to claim 2, wherein:

the semiconductor chip comprising a plurality of sides;

the plurality of bond fingers extend in a row substantially parallel to at least one side of the semiconductor chip or in an arc around the chip; and the trough extends between the semiconductor chip and the row of bond fingers such that a straight line can not be extended between the row of bond fingers and a side of the semiconductor chip without intersecting the trough.

4. The circuit assembly according to claim 3, comprising a row of bond fingers extending substantially parallel to at least two opposing sides of the semiconductor chip and a trough between each opposing side of the semiconductor chip and row of bond fingers, each trough extending substantially parallel to the opposing sides of the semiconductor chip.

5. The circuit assembly according to claim 2, wherein the trough has a width of about 0.05 mm to about 0.2 mm and a depth of about 0.03 mm to about 0.05 mm.

6. The circuit assembly according to claim 5, wherein the trough has a width of about 0.1 mm to about 0.15 mm and a depth of about 0.03 mm to about 0.035 mm.

7. The circuit assembly according to claim 2, further comprising a plurality of bond wires each electrically connecting a bond pad on an upper surface of the semiconductor chip to a bond finger.

8. The circuit assembly according to claim 2, wherein the solder mask comprises an epoxy-based resin, an acrylate-based resin, or a combination of an epoxy-based and acrylate-based resins.

9. The circuit assembly according to claim 2, wherein the adhesive resin comprises an epoxy-based resin, acrylate-based resin, a silicone or polyimide.

10. The circuit assembly according to claim 2, wherein the adhesive resin extends from under the semiconductor chip beyond the sides thereof on the solder mask.

11. The circuit assembly according to claim 10, wherein the adhesive resin extends into the trough.

* * * * *